United States Patent
Yamada et al.

[19]

[11] Patent Number: 5,925,139
[45] Date of Patent: Jul. 20, 1999

[54] MICROCOMPUTER CAPABLE OF PREVENTING WRITING ERRORS IN A NON-VOLATILE MEMORY

[75] Inventors: Susumu Yamada; Toru Watanabe; Shinichi Yamasaki, all of Moriguchi, Japan

[73] Assignee: Sanyo Electric Co., Ltd., Osaka, Japan

[21] Appl. No.: 08/821,598

[22] Filed: Mar. 20, 1997

[30] Foreign Application Priority Data

Mar. 25, 1996 [JP] Japan ..................................... 8-068390
Apr. 10, 1996 [JP] Japan ..................................... 8-088400

[51] Int. Cl.$^6$ .............................. G06F 1/30; G06F 11/00
[52] U.S. Cl. ................................ 714/14; 714/42; 714/54; 711/152; 711/155
[58] Field of Search ..................... 711/152, 155; 714/42, 54, 14

[56] References Cited

U.S. PATENT DOCUMENTS

| | | | |
|---|---|---|---|
| 4,485,456 | 11/1984 | Toyoda | 364/900 |
| 5,097,445 | 3/1992 | Yamauchi | 365/195 |
| 5,297,119 | 3/1994 | Tonegawa et al. | 368/41 |
| 5,381,366 | 1/1995 | Kawauchi et al. | 365/185 |
| 5,530,938 | 6/1996 | Akasaka et al. | 395/430 |

*Primary Examiner*—Glenn A. Auve
*Assistant Examiner*—Frantz B. Jean
*Attorney, Agent, or Firm*—Loeb & Loeb LLP

[57] ABSTRACT

When data are to be written in an EEPROM (1), a CPU (2) sets a flag (12). A voltage booster (13) boosts the power voltage in compliance with the setting of the flag (12). A voltage boost detector (14) detects whether the output of the voltage booster (13) is in voltage boost state. If the output of the voltage booster (13) is not in voltage boost state, a latch (15) is reset and the EEPROM (1) is not permitted to switch to write mode. As a result, it is possible to prevent incorrect data writing in the EEPROM (1) even when the flag (12) has been incorrectly set.

13 Claims, 5 Drawing Sheets

MICROCOMPUTER CAPABLE OF PREVENTING WRITING ERRORS IN A NON-VOLATILE MEMORY

BACKGROUND OF THE INVENTION

1. Field of the Invention

The present invention relates to a microcomputer containing an EEPROM (Electrically Erasable Programmable ROM) as a flash memory.

2. Description of the Related Art

A 1-chip microcomputer has a programmable memory (non-volatile memory) integrated over a single chip. A mask ROM, EPROM, EEPROM or the like is used as the programmable memory.

(1) Mask ROM

A microcomputer containing a mask ROM has the advantage that production efficiency can be improved and chip area reduced by manufacturing a plurality of masks in one batch. However, in the event of reprogramming, the plurality of masks must be re-manufactured, resulting in the disadvantages that considerable manufacturing time is required and the reprogramming request cannot be dealt with swiftly.

(2) EPROM

Use of an EPROM offers the advantage that a reprogramming request can be responded to swiftly by ultravioletly erasing the present data prior to writing in new data. However, since all present data are thereby ultravioletly erased, there is the drawback that data which did not require erasure must be rewritten.

(3) EEPROM

Use of an EEPROM offers the advantage that a reprogramming request can be responded to swiftly by electrically erasing the present data prior to writing in new data. In addition, since present data can be partially erased, data which do not need to be erased can be retained.

Recent 1-chip microcomputers utilize the advantages of all non-volatile memories and contain an EEPROM and a mask ROM. The EEPROM is used as a programmable memory for controlling the operation of the 1-chip microcomputer; the mask ROM is used as a programmable memory for rewriting EEPROM data. As a result, the 1-chip microcomputer can rewrite EEPROM data by itself with an improved level of versatility.

Let us consider a case in which the 1-chip microcomputer is designed to switch the EEPROM to write mode in compliance with the state of a flag. During the period between switch-on of the 1-chip microcomputer and power stabilization the flag inclines neither to "0" not to "1" and is therefore in an indeterminate state. However, when the flag value has accidentally been set to the same value as the logic value for switching the EEPROM to write mode, the EEPROM will switch to write mode even though the 1-chip microcomputer is not yet stable, with the resulting problem that the EEPROM writes incorrect data.

SUMMARY OF THE INVENTION

It is therefore the object of the present invention to provide a microcomputer capable of preventing errors in the writing of data in a non-volatile memory.

A microcomputer of the present invention contains a non-volatile memory in which data can be rewritten. When data are rewritten in the non-volatile memory, a CPU sets a flag to a specific logic value. A voltage booster boosts the power voltage when this flag is set to the specific logic value. In addition, a detector detects whether or not the output of the voltage booster exceeds a predetermined value. A memory controller then permits or inhibits data writing in the non-volatile memory based on a detection result of the detector. Consequently, writing of data in the non-volatile memory can be permitted only when the voltage booster output exceeds a predetermined value. A power supply having a variable voltage output may acceptably be provided instead of the voltage booster for generating 2 types of voltage: normal voltage and high voltage.

Furthermore, after the flag has been set to a specific logic value, the correctness of the flag setting is checked and a memory controller permits or inhibits data writing in the non-volatile memory based on the check result. The correctness of the flag is checked by determining whether or not a flag set command has been performed. For instance, the correctness of a flag can be checked based on the value of an address counter specifying a program command to be performed.

Furthermore, when the voltage booster output has exceeded a predetermined value, the CPU may acceptably set the address counter to the address of a program command for checking whether or not the flag setting is correct.

Furthermore, the detection result of the detector should preferably be stored in a latch so that a CPU detection result signal can be supplied at any time.

According to the present invention, data writing in the non-volatile memory can be inhibited when the flag has been incorrectly set at switch-on or as a result of power failure or the like.

DESCRIPTION OF THE PREFERRED EMBODIMENTS

The preferred embodiments of the present invention will next be explained with reference to the diagrams.

Embodiment 1

Figure 1:
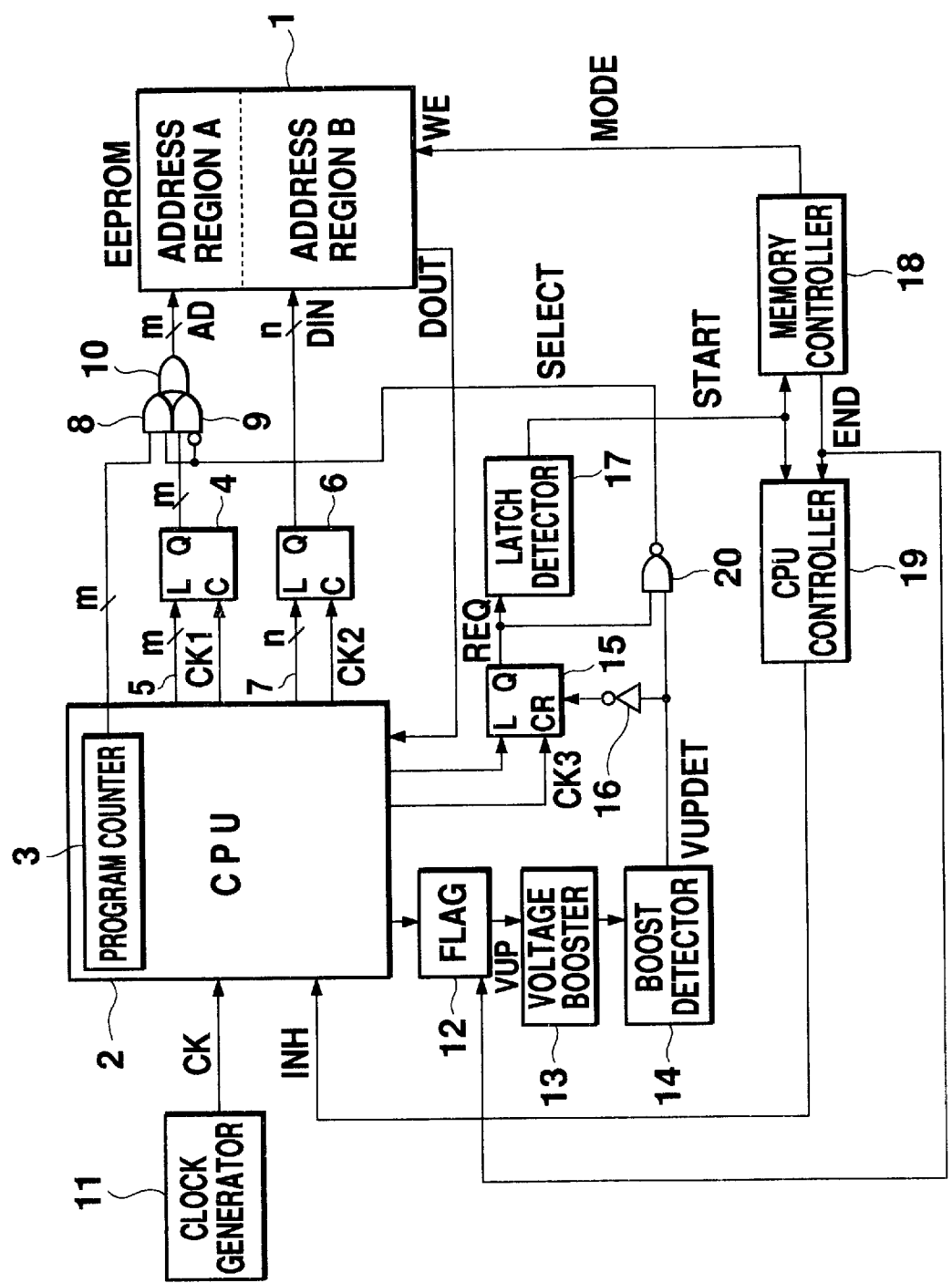
FIG. 1 is a block diagram showing a microcomputer in a first embodiment.
Figure 2:
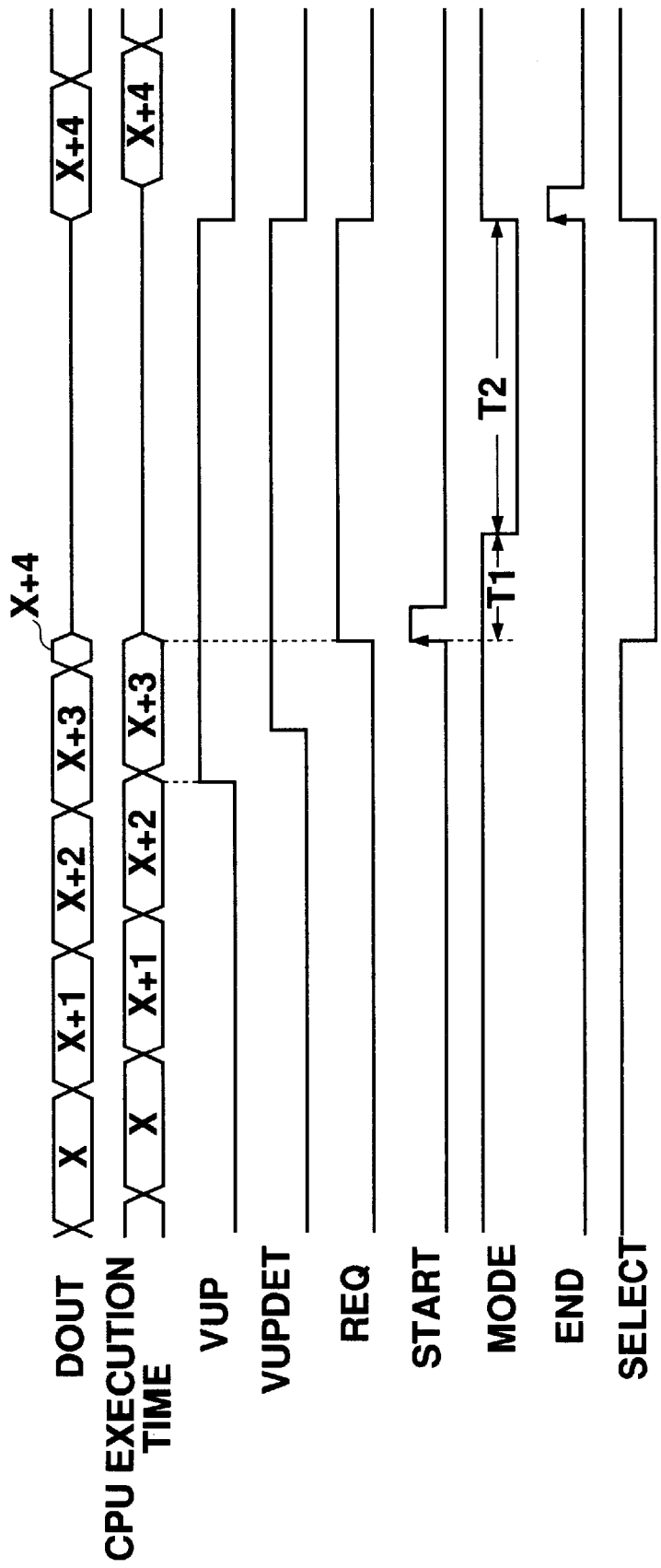
FIG. 2 is a timing chart showing the operation of the first embodiment.

FIG. 1 is a circuit block diagram showing a microcomputer in a first embodiment, integrated on a single chip. FIG. 2 is a timing chart for explaining the operation of FIG. 1.

In FIG. 1, (1) is an EEPROM. This EEPROM (1) is a non-volatile memory capable of repeatedly reading out and writing in data and also of electrically erasing data which have already been written. A region A within the EEPROM (1) is allocated to contain a program for rewriting data of the remaining region B, which is allocated to store data to be used for operation control programs and the like of the 1-chip microcomputer. The EEPROM (1) has a terminal AD to which address data are applied, a terminal DIN to which write data are applied, a terminal DOUT from which read data are outputted and a terminal WE to which a write mode setting signal is applied. A program in region A of the EEPROM (1) can easily be changed by supplying data from an external PROM writer (not shown in the diagram) to the EEPROM (1) and program changes can thus be dealt with swiftly.

(2) is a CPU which operates in compliance with data read out from the terminal DOUT of the EEPROM (1). This CPU (2) comprises components necessary for executing logic operations such as a program counter (3), an instruction register, an instruction decoder, an OR logic unit and the like.

(4) is a latch circuit. The number of latches provided is equal to the bit number m of the EEPROM (1) address data. Terminal L of the latch (4) is connected to the address terminal of the CPU (2) via m parallel address buses (5) and terminal C is likewise connected to one clock terminal of the CPU (2). In other words, the latch (4) latches address data in synchronism with the clock CK1, thereby functioning as an address holder.

(6) is a latch circuit. The number of latches provided is equal to the bit number n of 1 word ("word" here denotes the bit length of each address of the EEPROM (1), for example 1 bite) of the EEPROM (1). Terminal L of the latch (6) is connected to the address terminal of the CPU (2) via n parallel address buses (7), terminal C is likewise connected to another clock terminal of the CPU (2) and terminal Q is connected to the EEPROM (1) terminal DIN. In other words, the latch (6) latches write data in synchronism with the clock CK2 and supplies these latched data to the EEPROM (1), thereby functioning as a data holder.

AND gates (8) and (9) and OR gate (10) form a switch. The number of switches provided here is equal to the number of latches (4). One of the AND gate (8) input terminals is connected to the output terminal of the program counter (3), one of the AND gate (9) input terminals is connected to the Q terminal of the latch (4) and the output terminal of the OR gate (10) is connected to the terminal AD of the EEPROM (1). In other words, the switch supplies address data from either the program counter (3) or the latch (4) to the EEPROM (1) in accordance with a select signal SELECT (to be explained below).

(11) is a clock generator for generating a clock CK to operate the CPU (2). The CPU (2) creates a system clock based on clock CK.

(12) is a flag which is set to a logic value of "1" based on an instruction from the CPU (2) when setting the EEPROM (1) to write mode. The value of the flag (12) forms a signal VUP for instructing a voltage booster (to be explained below) to boost the voltage.

(13) is a voltage booster for receiving the signal VUP at logic value "1" and boosting the power VDD [normally output voltage VDD0] of the 1-chip microcomputer by +@ volts. (14) is a voltage boost detector for detecting the (VDD0+@) voltage boost in the output of the voltage booster. The voltage boost detector (14) outputs a logic value of "0" when the output of the voltage booster (13) is less than (VDD0+@) and outputs a logic value of "1" when the output of the voltage booster (13) is equal to or greater than (VDD0+@). The output of the voltage boost detector (14) is a signal VUPDET. The voltage boost detector (14) is provided with the detected state of the power VDD, but since no means of directly detecting the state of the power VDD is available the voltage boost detector (14) detects the boost voltage @ which changes in proportion to the power VDD. If the power VDD can be outputted at both high and low voltages, the voltage of the power VDD may be switched between these two voltages in accordance with the state of the flag (12).

(15) is a latch, the R terminal of which is connected to the output terminal of the voltage boost detector (14) via an inverter (16). The latch (15) is reset when the voltage boost detector (14) has detected (VDD0+@) volts. The latch (15) then latches a logic value of "1" in synchronism with the clock CK3 based on an instruction from the CPU (2). The output of the Q terminal of the latch (15) is the signal REQ.

(17) is a latch detector for outputting a start pulse START in synchronism with the rising edge of the signal REQ from the Q terminal of the latch (15) when signal REQ has changed to logic value "1". The latch detector (17) may for instance consist of a 1-shot multi-circuit or the like which is cleared when the signal REQ has a "0" logic value.

(18) is a memory controller for outputting a mode control signal MODE in order to set the EEPROM (1) to read mode or write mode. The memory controller (18) detects the rising edge of the start pulse START, outputs a mode control signal MODE which falls to the low level at time T2 only after a period of time T1 has elapsed from the rising edge and supplies this mode control signal MODE to terminal WE of the EEPROM (1). In other words, the EEPROM (1) is set at write mode for rewriting address region data only during the period when the mode control signal MODE is at the low level. Period T2 is set to the period of time required to write data in the specified address region B of the EEPROM (1). The memory controller (18) detects the rising edge of the mode control signal MODE after period T2 has elapsed and outputs an end pulse END. The flag (12) is reset at the rising edge of the end pulse END.

(19) is a CPU controller. The time required by the EEPROM (1) to execute 1 command is sec units, but the data writing time of the EEPROM (1) is m sec units, i.e. it is extremely long. Therefore, during the period T2 during which the EEPROM (1) is set to write mode, it is necessary to inhibit the CPU (2) from being influenced by the undefined output of the EEPROM (1) terminal DOUT and to stop the program counter (3) at its current value. The CPU controller (19) therefore outputs an inhibit signal INH only during the period from the rising edge of the start pulse START to the rising edge of the end pulse end pulse END (the period T1+T2). The CPU (2) detects the inhibit signal INH and executing inhibiting by means of an operation such as stopping the system clock.

An AND gate (20) performs an AND calculation using signals VUPDET and REQ and outputs a select signal SELECT. The select signal SELECT falls to the low level when the logic values of both signal VUPDET and signal REQ have changed to "1". The flag (12) is reset by the rising edge of the end pulse end pulse END. Since the voltage booster (13) now ceases boosting, the signal VUP falls to logic value "0", the latch (15) is reset and the signal REQ also falls to logic value "0". The select signal SELECT therefore rises to the high level. The switch supplies address data latched by the latch (4) to terminal AD of the EEPROM (1) only during the period in which the select signal SELECT is at the lower level.

The operation of FIG. 1 will next be explained based on the timing chart shown in FIG. 2. In the initial state, the mode control signal MODE and select signal SELECT are outputting at the high level and the EEPROM (1) is set to read mode for reading out data at an address specified by the program counter (3). Program command X is a command to latch address data at latch (4), program command X+1 is a command to latch write data at a latch (6), program command X+2 is a command to set the flag (12) to a logic value of "1" and program command X+3 is a command to set the latch (15) to a logic value of "1".

When program command X is read out from terminal DOUT of the EEPROM (1), the CPU (2) decodes the program command X and the latch (4) latches the address data in synchronism with the clock CK1.

When the program counter (3) is incremented by +1 and program command X+1 is read out from terminal DOUT of the EEPROM (1), the CPU (2) decodes the program command X+1 and the latch (6) latches the address data in synchronism with the clock CK2.

When the program counter (3) is further incremented by +1 and program command X+2 is read out from terminal DOUT of the EEPROM (1), the CPU (2) decodes the program command X+2. This sets the flag (12) and the voltage booster (13) commences boosting after receiving the signal VUP with a logic value of "1". The voltage boost detector (14) outputs signal VUPDET with a logic value of "1" when the boosted voltage has reached (VDD+@). The latch (15) is now reset.

When the program counter (3) is further incremented by +1 and program command X+3 is read out from terminal DOUT of the EEPROM (1), the CPU (2) decodes the program command X+3. As a result, signal REQ from the Q terminal of the latch (15) changes to a logic value "1" and the latch detector (17) outputs a start pulse START. The memory controller (18) receives the start pulse START and outputs a mode control signal MODE and an end pulse END. A CPU controller (19) receives the start pulse START and the end pulse END and outputs an inhibit signal INH. Therefore, the select signal SELECT is output at the low level only during the period (T1+T2).

Consequently, the inhibit signal INH is generated during the rewriting of data in address region B of the EEPROM (1), thereby enabling the CPU (2) to ignore the undefined output of the terminal DOUT of the EEPROM (1) and also to hold the program counter (3) at a value corresponding to the generation of the start pulse START. As a result, CPU (2) malfunctions occurring during the rewriting of EEPROM (1) data can be prevented.

Furthermore, signal VUPDET outputs a "0" logic value until the boost voltage reaches (VDD+@) volts during the period between turning on the power VDD of the 1-chip microcomputer until the stabilization of power VDD, even when the flag (12) and the latch (15) have attained logic values of "1" due to external factors and the like. Therefore, the latch (15) is reset, signal REQ outputs a "0" logic value and the EEPROM (1) is not set to write mode; adverse conditions which may lead to mistaken writing in address region B of the EEPROM (1) can thus be eliminated.

Furthermore, when a failure occurs in the power VDD during data rewriting in address region B of the EEPROM (1), the signal VUP logic value changes to loll and the latch (15) is reset. The select signal SELECT changes to a logic value of "1" when signal REQ has changed to a logic value of "0". The rewriting of data in address region B of the EEPROM (1) can thus be cancelled and adverse conditions which may lead to mistaken writing in address region B of the EEPROM (1) can be eliminated.

According to the present embodiment, CPU malfunctions can be reliably prevented when rewriting data in the remaining address region of a non-volatile memory. Furthermore, there are additional advantages such as the ability to prevent mistaken writing in the remaining address region of the non-volatile memory.

Embodiment 2

Figure 3:
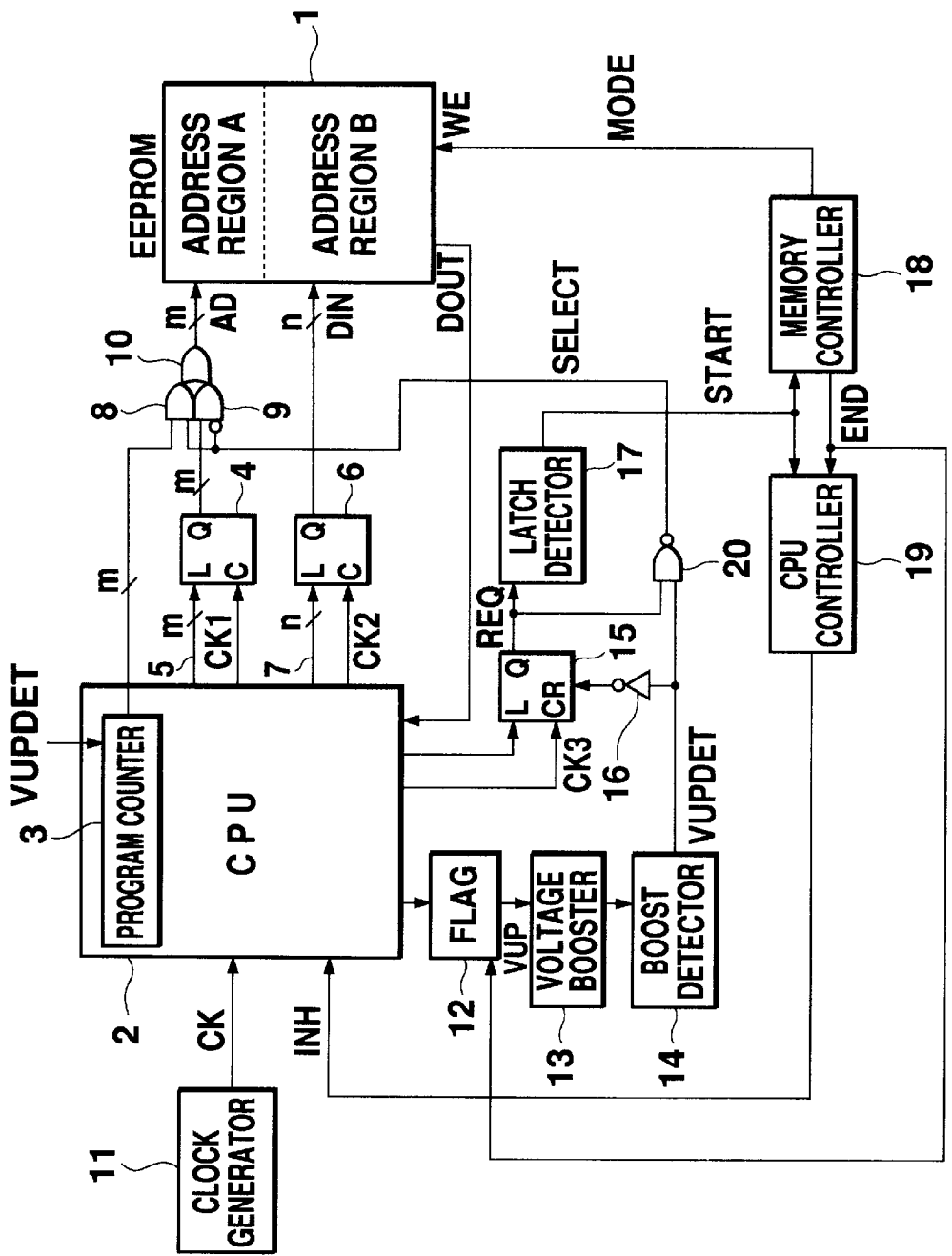
FIG. 3 is a block diagram showing a microcomputer in a second embodiment.
Figure 4:
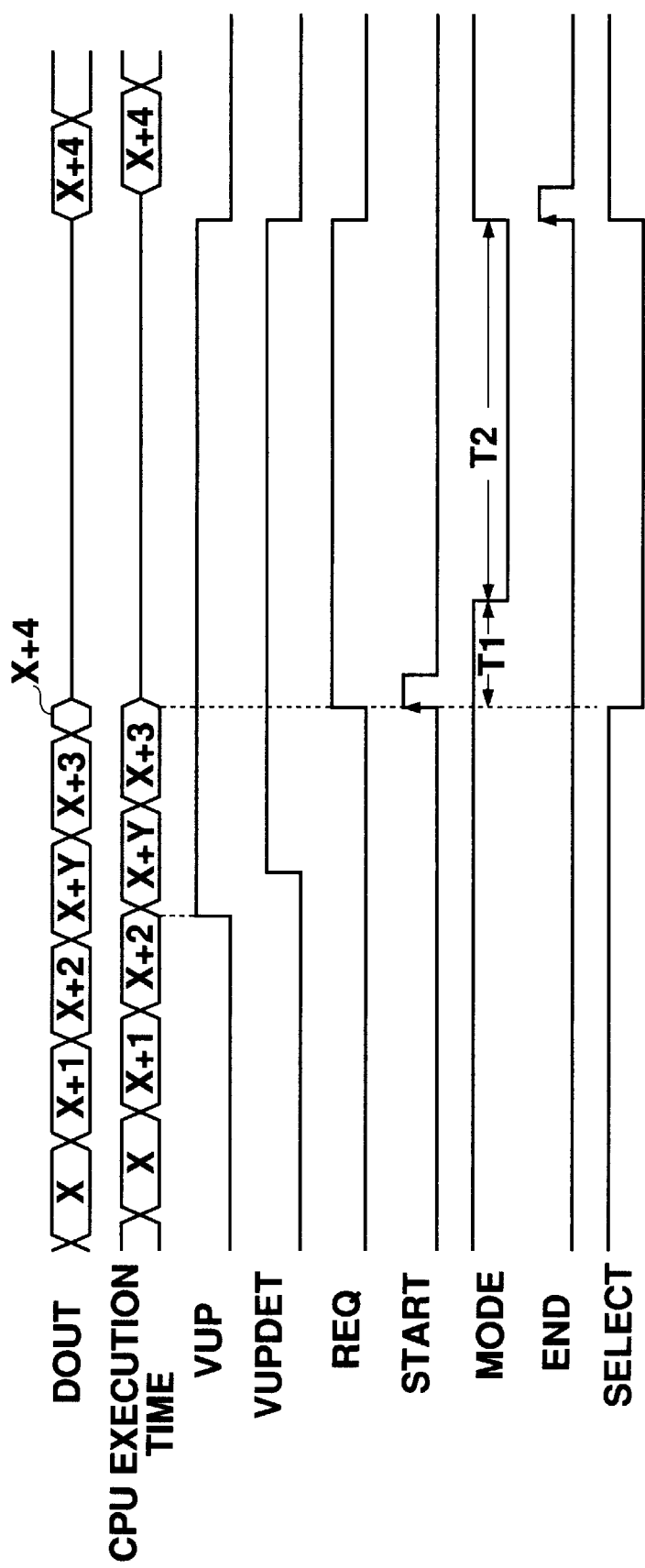
FIG. 4 is a timing chart showing the operation of the second embodiment.
Figure 5:
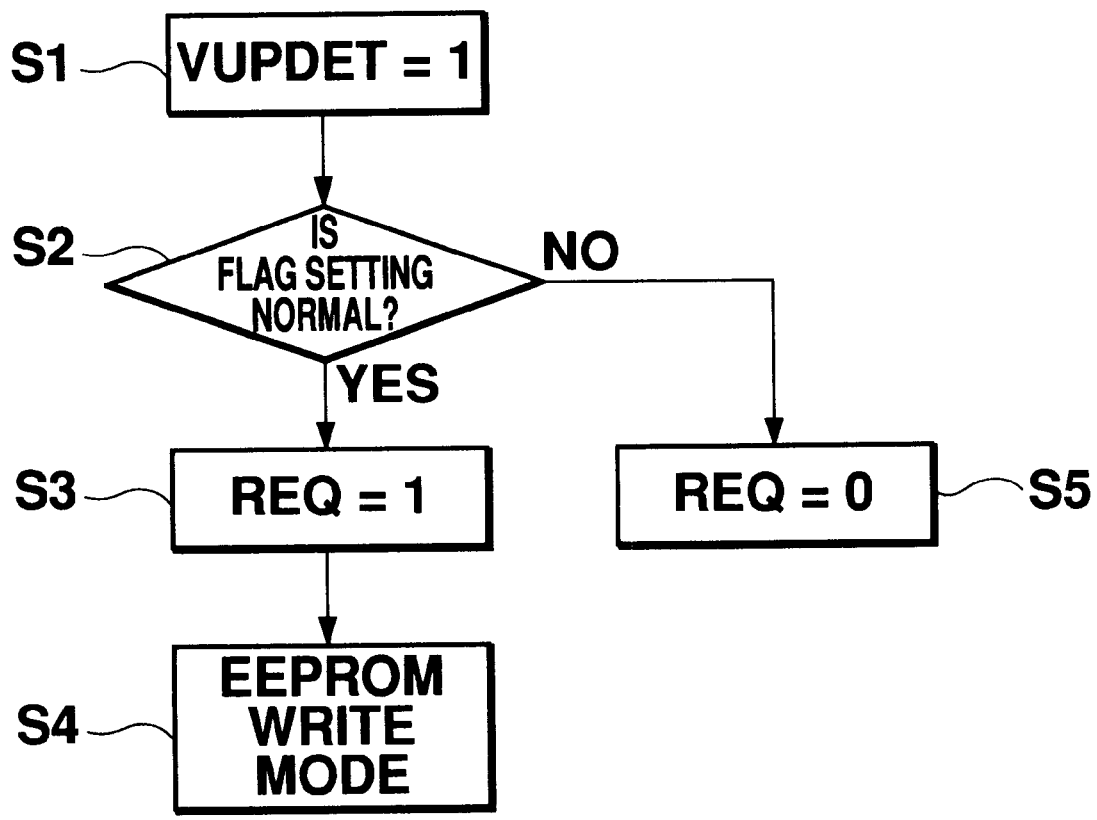
FIG. 5 is a flowchart showing the operation of the second embodiment.

FIG. 3 is a block diagram showing a microcomputer in a second embodiment. FIG. 4 is a timing chart showing the operation of the microcomputer in FIG. 3 and FIG. 5 is a flowchart showing the operation of the microcomputer in FIG. 3.

In FIG. 3, a mode control signal MODE supplied to terminal WE of the EEPROM (1) by the memory controller (18) sets the EEPROM (1) to read mode or write mode. The mode control signal MODE is output at the low level and the EEPROM (1) is in write mode as in the first embodiment.

When signal VUP has changed to a logic value of "1", the program counter (3) contained in the CPU (2) is set to a specific value in compliance therewith.

The operation of FIG. 3 will next be explained with reference to the timing chart in FIG. 4 and the flowchart in FIG. 5. In the initial state, the mode control signal MODE and select signal SELECT are outputting at the high level and the EEPROM (1) is set to read mode for reading out data at an address specified by the program counter (3). Program command X is a command to latch address data at latch (4), program command X+1 is a command to latch write data at a latch (6), program command X+2 is a command to set the flag (12) to a logic value of "1", program command X+Y is a command to determine whether or not the logic value has been set to "1" based on program command X+2 and program command X+3 is a command to set the latch (15) to a logic value of "1" when it has been determined that the flag (12) has been set to a logic value of "1" based on program command X+2. Program command X+Z is a branch command to inhibit the setting of the latch (15) to a logic value of "1" when it has been determined that the flag (12) has for some reason been mistakenly set to a logic value of "1". In an embodiment of the present invention, program commands X, X+1, X+2, X+3, X+Y and X+Z comprise data written in address region A of the EEPROM (1).

When program command X is read out from terminal DOUT of the EEPROM (1), the CPU (2) decodes the program command X and the latch (4) latches the address data in synchronism with the clock CK1.

When the program counter (3) is incremented by a predetermined value and program command X+1 is read out from terminal DOUT of the EEPROM (1), the CPU (2) decodes the program command X+1 and the latch (6) latches the address data in synchronism with the clock CK2.

When the program counter (3) is incremented by a predetermined value and program command X+2 is read out from terminal DOUT of the EEPROM (1), the CPU (2) decodes the program command X+2. This sets the flag (12) and the voltage booster (13) commences boosting after receiving the signal VUP with a logic value of "1". The voltage boost detector (14) outputs the signal VUPDET with a logic value of "1" when the boosted voltage has reached (VDD+@) (S1). The latch (15) is now reset. Simultaneously, the program counter (3) receives the signal VUPDET with a logic value of "1" and address data X+Y are set. Address data X+Y are data specifying an address X+Y in address region B of the EEPROM (1).

When program command X+Y for address X+Y is read out from the terminal DOUT of the EEPROM (1), the CPU (2) decodes the program command X+Y. Then, when it has been determined that the flag (12) has been set in accordance with program command X+2 (S2:YES), the operation sequence jumps to address X+3 in address region A of the EEPROM (1).

When the program command X+3 is read out from the terminal DOUT of the EEPROM (1), the CPU (2) decodes program command X+3. This causes the signal REQ from the Q terminal of the latch (15) to change to logic value "1"

(S3) and the latch detector (17) outputs a start pulse START. The memory controller (18) receives the start pulse START and outputs a mode control signal MODE and an end pulse END (S4). The CPU controller (19) receives the start pulse START and the end pulse END and outputs an inhibit signal INH. The select signal SELECT is therefore output at the low level during the period (T1+T2) only.

Alternatively, when it has been determined that the flag (12) has for some reason been incorrectly set to logic value "1" after program command X+Y has been read out from the terminal DOUT of the EEPROM (1) (S2:NO), the operation sequence jumps to address X+Z in address region B of the EEPROM (1). When the program command X+Z is read out from the terminal DOUT of the EEPROM (1), the CPU (2) decodes program command X+Z and the latch (15) is inhibited from being set to a logic value of "1".

Consequently, an inhibit signal INH is generated during the rewriting of data in address region B of the EEPROM (1), thereby enabling the CPU (2) to ignore the undefined output of the terminal DOUT of the EEPROM (1) and also to hold the program counter (3) at a value corresponding to the generation of the start pulse START. As a result, CPU (2) malfunctions occurring during the rewriting of EEPROM (1) data can be prevented.

Furthermore, when the flag (12) has been incorrectly set to a logic value of "1" for some reason resulting from the operation state of the 1-chip microcomputer, it is possible to inhibit the latch (15) from also being set to a logic value of "1". Therefore, the signal REQ changes to a "0" logic value while the latch (15) remains in the reset state, the EEPROM (1) is not set to write mode and adverse conditions which may lead to mistaken writing in address region B of the EEPROM (1) can be eliminated.

Furthermore, when power VDD has failed during rewriting of data in address region B of the EEPROM (1), the signal VUP changes to a logic value of "0" and the latch (15) is reset. The select signal SELECT changes to a logic value of "1" when the signal REQ has changed to a logic value of "0". The rewriting of data in address region B of the EEPROM (1) can thus be cancelled and adverse conditions caused by power VDD failure which may lead to mistaken writing in address region B of the EEPROM (1) can be eliminated.

While there have been described what are at present considered to be preferred embodiments of the invention, it will be understood that various modifications may be made thereto, and it is intended that the appended claims cover all such modifications as fall within the true spirit and scope of the invention.

What is claimed is:

1. A microcomputer containing a non-volatile memory capable of reading and writing data, comprising:
   a CPU for executing program commands;
   a flag which is set to a first logic value by the CPU based on a program command;
   a voltage booster for boosting a power voltage and outputting a boosted voltage when the flag is set to the first logic value;
   a detector for detecting the boosted voltage and outputting a second logic value when the detected voltage is lower than a predetermined level and a third logic value when the detected voltage is equal to or higher than the predetermined level;
   a latch which is reset when the output of the detector is the second logic value and is released from being reset when the output of the detector is the third logic value; and
   a memory controller for setting the non-volatile memory to a state wherein data can be written when the latch output is set to a logic value different from the logic value when the latch is reset.

2. A microcomputer according to claim 1, wherein:
   data are written in the non-volatile memory using a power voltage boosted by the voltage booster.

3. A microcomputer containing a non-volatile memory storing a plurality of program commands and capable of reading and writing data, comprising:
   a CPU for executing program commands, the CPU having an address counter for sending an address instruction to the non-volatile memory;
   a flag which is set to a first logic value by the CPU based on a program command;
   a detector for outputting a logic value based on a power voltage state when the flag is set at the first logic value;
   a latch which is reset when the output of the detector is a second logic value and is released from being reset when the output of the detector is a third logic value; and
   a memory controller for setting the non-volatile memory to a state to permit writing of data when the latch output is set to a logic value different from the logic value when the latch is reset,
   wherein the CPU sets the address counter to a specific value based on the output of the detector when the flag is set to the first logic value, and
   wherein the CPU determines whether or not the flag is set correctly by decoding a program command read out from the non-volatile memory when the address counter is set to the specific value.

4. A microcomputer according to claim 3, wherein when the CPU has determined that the flag has been incorrectly set, the CPU inhibits the latch from reaching a logic value different from the reset value.

5. A microcomputer containing a non-volatile memory capable of reading and writing data, comprising:
   a CPU for executing program commands;
   a flag which is set to a first logic value by the CPU based on a program command;
   a detector for outputting a logic value based on a power voltage state when the flag is set at the first logic value;
   a latch which is reset when the output of the detector is a second logic value and is released from being reset when the output of the detector is a third logic value; and
   a memory controller for setting the non-volatile memory to a state to permit writing of data when the latch output is set to a logic value different from the logic value when the latch is reset,
   wherein when the memory controller permits writing of data in the non-volatile memory, the CPU ignores output read out from the non-volatile memory.

6. A microcomputer according to claim 5, wherein the non-volatile memory is partitioned into first and second regions; and
   a program command for writing second region data is stored in the first region.

7. A microcomputer containing a non-volatile memory capable of reading and writing data, comprising:
   a flag set to a specific logic value when data are rewritten in the non-volatile memory;
   a voltage booster for boosting a power voltage when the flag is set to the specific logic value; and a detector for detecting whether or not the boosted power voltage exceeds a predetermined value; and a memory controller for permitting or inhibiting data writing in the non-volatile memory based on a detection result of the detector.

8. A microcomputer containing a non-volatile memory capable of reading and writing data, comprising:

a flag set to a specific logic value when data are rewritten in the non-volatile memory;

a detector for detecting whether or not a power voltage exceeds a predetermined value when the flag is set to the specific logic value; and a memory controller for permitting or inhibiting data writing in the non-volatile memory based on a detection result of the detector, wherein after the flag is set to a specific logic value, the correctness of the flag setting is checked; and wherein the memory controller permits or inhibits data writing in the non-volatile memory based on the check result.

9. A microcomputer according to claim 8, wherein after the flag is set to the specified value, the correctness of the flag setting is checked when the detector detects that the power voltage exceeds a predetermined value.

10. A microcomputer according to claim 9, wherein the non-volatile memory stores a plurality of program commands; and the microcomputer further comprises:

a CPU for performing the program commands; wherein the CPU performs a specific program command when the power voltage has exceeded a predetermined value and determines whether or not the flag setting is correct.

11. A microcomputer according to claim 10, wherein the CPU has an address counter for specifying a read address in the non-volatile memory; and the address counter is set to an address of the specified program command when the output of the voltage booster has exceeded a predetermined value.

12. A microcomputer containing non-volatile memory capable of reading and writing data, comprising:

a CPU for performing program commands, the CPU having an address counter for sending an address instruction to the non-volatile memory;

a flag which is set to a first logic value by the CPU based on a program command;

a voltage booster for boosting a power voltage when the flag is set at the first logic value;

a detector for detecting the boosted voltage and outputting a second logic value when the detected voltage is lower than a predetermined level and a third logic value when the detected voltage is equal to or higher than the predetermined level;

a latch which is reset when the output of the detector is the second logic value and is released from being reset when the output of the detector is the third logic value; and a memory controller for setting the non-volatile memory to a state wherein data can be written when the latch output is set to a logic value different from the logic value when the latch is reset, wherein the CPU sets the address counter to a specific value based on the output of the detector when the flag is set to the first logic value, and wherein the CPU determines whether or not the flag is set correctly by decoding a program command read out from the non-volatile memory when the address counter is set to the specific value.

13. A microcomputer according to claim 12, wherein during a period from when a power is supplied to when it is stabilized, when the flag is incorrectly set to the first logic value, the latch is reset if the detected boosted voltage is less than the predetermined level, thereby preventing erroneous writing to the non-volatile memory.

* * * * *